(12) United States Patent
Honda

(10) Patent No.: US 10,707,641 B2
(45) Date of Patent: Jul. 7, 2020

(54) LASER OSCILLATOR

(71) Applicant: FANUC CORPORATION, Yamanishi (JP)

(72) Inventor: Masahiro Honda, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/394,496

(22) Filed: Apr. 25, 2019

(65) Prior Publication Data

US 2019/0334310 A1  Oct. 31, 2019

(30) Foreign Application Priority Data

Apr. 26, 2018  (JP) ................. 2018-085502

(51) Int. Cl.
*H01S 3/00*   (2006.01)
*H01S 5/022*  (2006.01)
*H01S 5/40*   (2006.01)

(52) U.S. Cl.
CPC ........ *H01S 5/02208* (2013.01); *H01S 5/4025* (2013.01); *H01S 5/0222* (2013.01); *H01S 5/4012* (2013.01)

(58) Field of Classification Search
CPC .. H01S 5/02208; H01S 5/0222; H01S 5/4012; H01S 5/4015
See application file for complete search history.

(56) References Cited

U.S. PATENT DOCUMENTS

| 6,370,174 B1* | 4/2002 | Onkels ............... G03F 7/70025 |
| | | 372/38.04 |
| 2017/0070024 A1* | 3/2017 | Kawasuji ............... H01S 3/104 |
| 2017/0163006 A1* | 6/2017 | Honda ................. H05B 45/37 |
| 2017/0222565 A1* | 8/2017 | Sonobe .................. H02M 1/14 |

FOREIGN PATENT DOCUMENTS

| JP | S64-23589 A | 1/1989 |
| JP | 2005-236030 A | 9/2005 |
| JP | 2017103413 A | 6/2017 |

OTHER PUBLICATIONS

An Office Action mailed by the Japanese Patent Office dated May 12, 2020, which corresponds to Japanese Patent Application No. 2018-085502 and is related to U.S. Appl. No. 16/394,496.

* cited by examiner

*Primary Examiner* — Kinam Park
(74) *Attorney, Agent, or Firm* — Studebaker & Brackett PC

(57) ABSTRACT

To provide a compact laser oscillator. A laser oscillator includes input power supplies, a transformer unit that adjusts a voltage of the power supplies, and an oscillator unit connected to the transformer unit. The oscillator unit outputs a laser beam corresponding to the voltage adjusted by the transformer unit. The transformer unit is arranged below at least a part of the oscillator unit.

8 Claims, 6 Drawing Sheets

LASER OSCILLATOR

This application is based on and claims the benefit of priority from Japanese Patent Application No. 2018-085502, filed on 26 Apr. 2018, the content of which is incorporated herein by reference.

BACKGROUND OF THE INVENTION

Field of the Invention

The present invention relates to a laser oscillator.

Related Art

A conventional laser machine that uses a laser beam to cut a workpiece is known. A laser machine is provided with a laser oscillator for generating a laser beam emitted to a workpiece. It is necessary to adjust a current flowing through an LD module for adjusting output intensity of the laser beam. Therefore, a power supply unit that adjusts the current is provided.

The power supply unit adjusts a power supply voltage supplied from a distribution board or the like according to differences in power supply situations of each country such that the power supply voltage is suited to as input voltage of a laser oscillator. For example, although power supply voltages are 480 [V] in the US and 380 [V] in China, there is a case where the input voltage of the laser oscillator is designed to be 200 [V]. In this case, it is regular for a power supply unit to include a transformer to decrease the power supply voltage to 200 [V].

The power supply unit of the laser oscillator is generally provided separately from the laser oscillator. For example, in the laser oscillator of Patent Document 1, a cabinet that accommodates a power supply unit is installed adjacent to the outside of a cabinet that accommodates the laser oscillator.

Patent Document 1: Japanese Unexamined Patent Application, Publication. No. 2017-103413

SUMMARY OF THE INVENTION

However, when output intensity of the laser beam is increased, a large number of transformers need to be provided. In this case, since a large number of transformers are accommodated in the power supply unit of the oscillator, the power supply unit is large, and an installation area is also large. In this way, with regular technology such as Patent Document 1, the oscillator as a whole becomes large in some cases.

An object of the present invention is to provide a compact laser oscillator.

(1) A laser oscillator (for example, a laser oscillator 1 described later) of the present invention includes: a transformer unit (for example, a transformer unit 10 described later) that adjusts a voltage of a power supply; an input power supply unit that inputs the voltage adjusted by the transformer unit to an oscillator unit; and an oscillator unit (for example, an oscillator unit 40 described later) that is connected to the input power supply unit and outputs a laser beam according to the voltage of the input power supply unit, in which the transformer unit is arranges below at least a part of the oscillator unit.

(2) In the laser oscillator of (1), the transformer unit may include a plurality of transformers (for example, transformers 11 to 14 described later), the input power supply unit may include a plurality of input power supplies (input power supplies 21 to 32), and the input power supplies may be provided for each of the plurality of transformers.

(3) In the laser oscillator of (1) or (2), the transformer unit may include a plurality of input terminals (for example, input terminals LA1 to LA3 described later), and a plurality of output terminals (for example, output terminals RA1 to RA3 described later) corresponding to the plurality of input terminals, respectively, and the transformer unit may convert a voltage input from each of the plurality of input terminals into a predetermined voltage to output the predetermined voltage from the corresponding plurality of output terminals.

(4) The laser oscillator of any of (1) to (3) may further include a power factor control unit (for example, reactors 71 to 74 described later) for improving a power factor of the transformer unit in a preceding stage of the input power supply unit.

According to the present invention, a compact laser oscillator can be provided.

DETAILED DESCRIPTION OF THE INVENTION

Figure 1A:
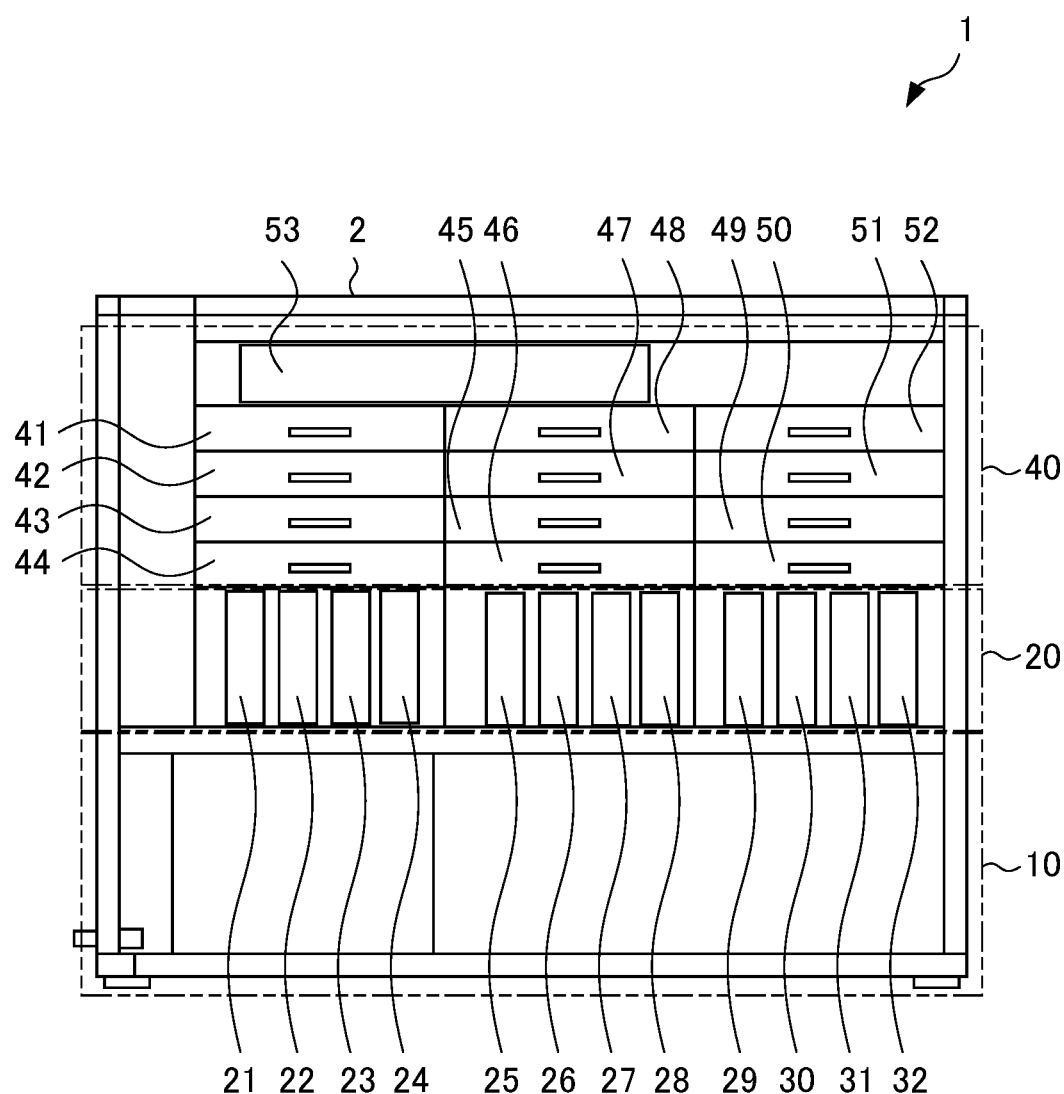
FIG. 1A is a front view showing an external appearance of a laser oscillator according to a first embodiment of the present invention.
Figure 1B:
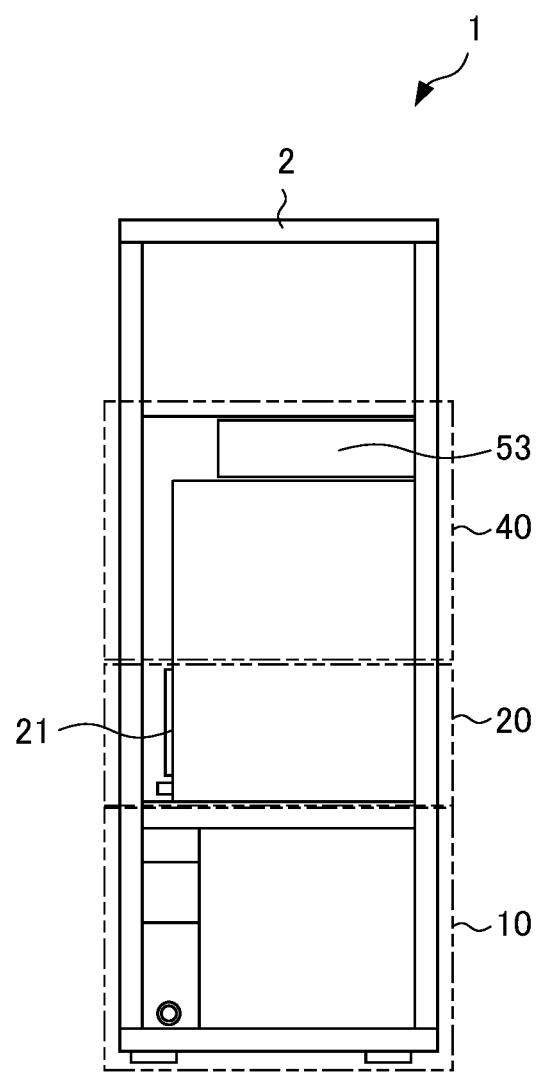
FIG. 1B is a side view showing the external appearance of the laser oscillator according to the first embodiment of the present invention.

Embodiments of the present invention will be described below with reference to the drawings. FIG. 1A is a front view showing an external appearance of a laser oscillator according to a first embodiment of the present invention, and FIG. 1B is a side view of the external appearance. Hereinafter, a direction from front to rear in the paper plane of a drawing is defined as front of a cabinet 2, an opposite direction of the front is defined as rear, a vertical direction in the paper plane of a drawing is defined as a vertical direction of the cabinet 2, and a horizontal direction in the paper plane of a drawing is defined as a horizontal direction of the cabinet 2.

A laser oscillator 1 includes: the cabinet 2; a transformer unit 10 accommodated in the cabinet 2; an input power supply unit 20; and an oscillator unit 40. The oscillator unit 40 is connected to the transformer unit 10. The transformer unit 10 is connected to the input power supply unit 20, and adjusts a voltage from the input power supply unit 20 to input the adjusted voltage to the oscillator unit 40.

In FIG. 1A and FIG. 1B, the transformer unit 10 is arranged below the oscillator unit 40 and the input power supply unit 20. This arrangement is an example. It is preferable that the transformer unit 10 be provided below the input power supply unit 20 and the oscillator unit 40, since the transformer unit 10 has a relatively larger weight than those of the input power supply unit 20 and the oscillator unit 40.

The input power supply unit 20 includes a plurality of input power supplies as shown as input power supplies 21 to 32. The transformer unit 10 also includes a plurality of transformers that are not shown, and the input power supply is connected to each of the transformers. The oscillator unit 40 is provided with laser cavity units 41 to 52. For example, the laser cavity unit 41 is connected to the input power supply 21, and the laser cavity unit 42 is connected to the input power supply 22. In a similar manner, other laser cavity units 43 to 52 are connected to the input power supplies 23 to 32, respectively.

A beam combiner 53 is attached to the upper portion of the laser cavity units 41 to 52. The beam combiner 53 combines all or any of laser beams of the plurality of laser cavity units 41 to 52. The combined laser beam is output from a laser cutting head that is not shown in FIG. 1A.

Figure 2:
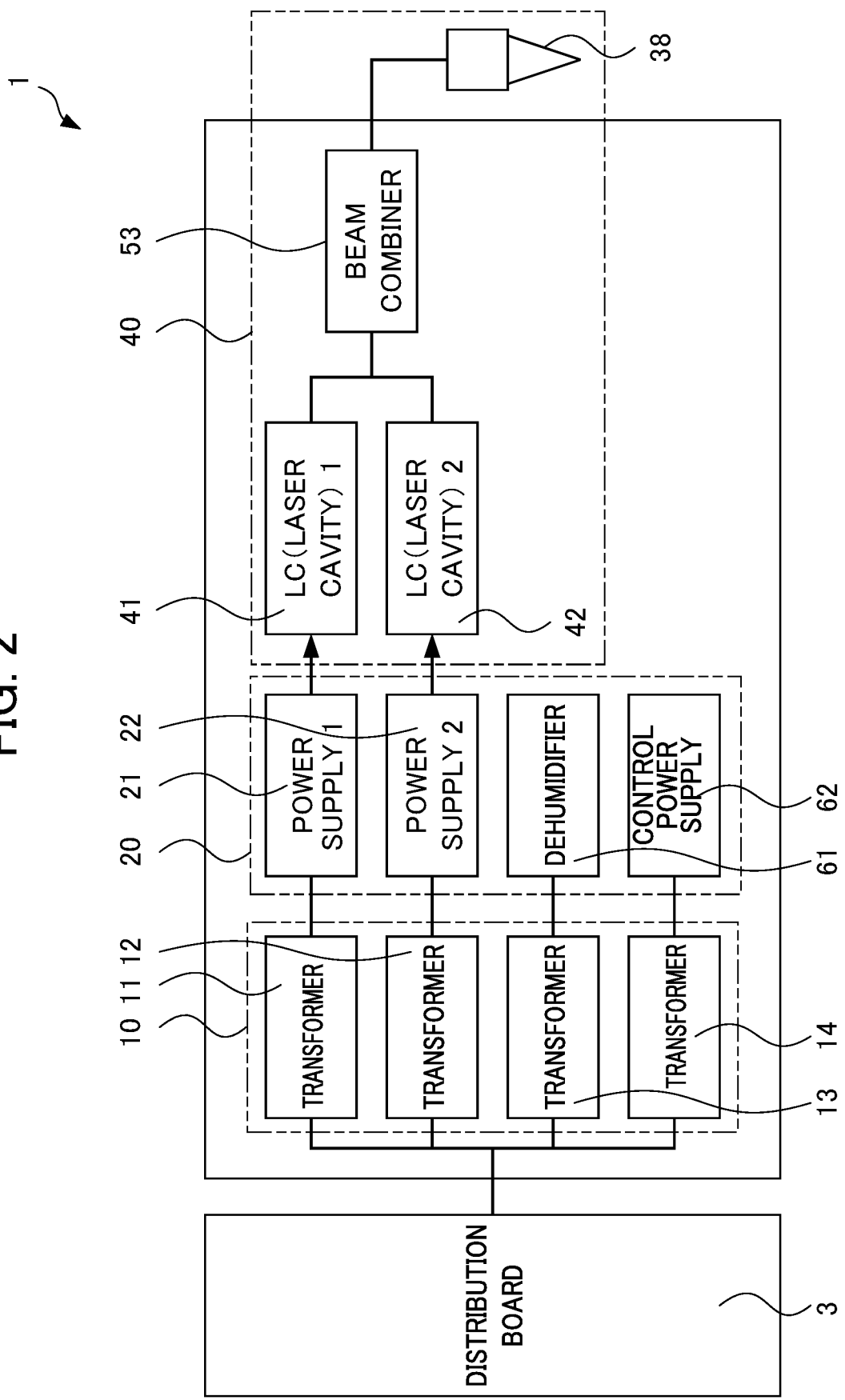
FIG. 2 is a diagram showing an electrical configuration of the laser oscillator according to the first embodiment of the present invention.

FIG. 2 is a diagram showing an electrical configuration of the laser oscillator according to the first embodiment of the present invention. For simplicity, a part of FIG. 1 is shown in FIG. 2. The laser oscillator 1 operates by electric power supplied from a distribution board 3. The laser oscillator 1 includes, in order from an input side of power from the distribution board 3, the transformer unit 10, the input power supply unit 20, and the oscillator unit 40. The voltage applied by the distribution board 3 is converted into a voltage that is suited to the input power supply unit 20 in the transformer unit 10, and the converted voltage is applied to the oscillator unit 40. The oscillator unit 40 outputs a laser beam corresponding to a current from the input power supply unit 20.

The transformer unit 10 includes transformers 11 to 14. The input power supply unit 20 includes input power supplies 21, 22, a dehumidifier 61, and a control power supply 62. The transformers 11 to 14 of the transformer unit are provided in each input power supply. That is, the transformer 11 is connected to the input power supply 21, the transformer 12 is connected to the input power supply 22, the transformer 13 is connected to an input power supply of the dehumidifier 61, and the transformer 14 is connected to the control power supply 62.

The transformer 11 increases or decreases the voltage of the distribution board 3 in the transformer 11 to input the obtained voltage to the input power supply 21 so as to provide the power supply voltage corresponding to a required voltage of the laser cavity unit 41. The transformer 12 also performs similar processing according to a required voltage of the input power supply 22. The transformer 13 adjusts the voltage of the distribution board 3 such that the voltage is suited to a voltage of the input power supply of the dehumidifier 61, and the transformer 14 adjusts the voltage of the distribution board 3 such that the voltage is suited to a required voltage of the control power supply 62.

The oscillator unit 40 includes laser cavity units 41, 42, a beam combiner 53, and a laser cutting head 38. The laser cavity unit 41 generates a laser beam corresponding to the voltage adjusted in the input power supply 21, and the laser cavity unit 42 generates a laser beam corresponding to the voltage adjusted in the input power supply 22. The beam combiner 53 combines the laser beams generated in the laser cavity units 41, 42 to input the combined laser beam to the laser cutting head. The laser cutting head 38 emits the laser beam to a workpiece. On the other hand, the humidifier 61 performs a dehumidification operation on the basis of the adjusted voltage.

Figure 3:
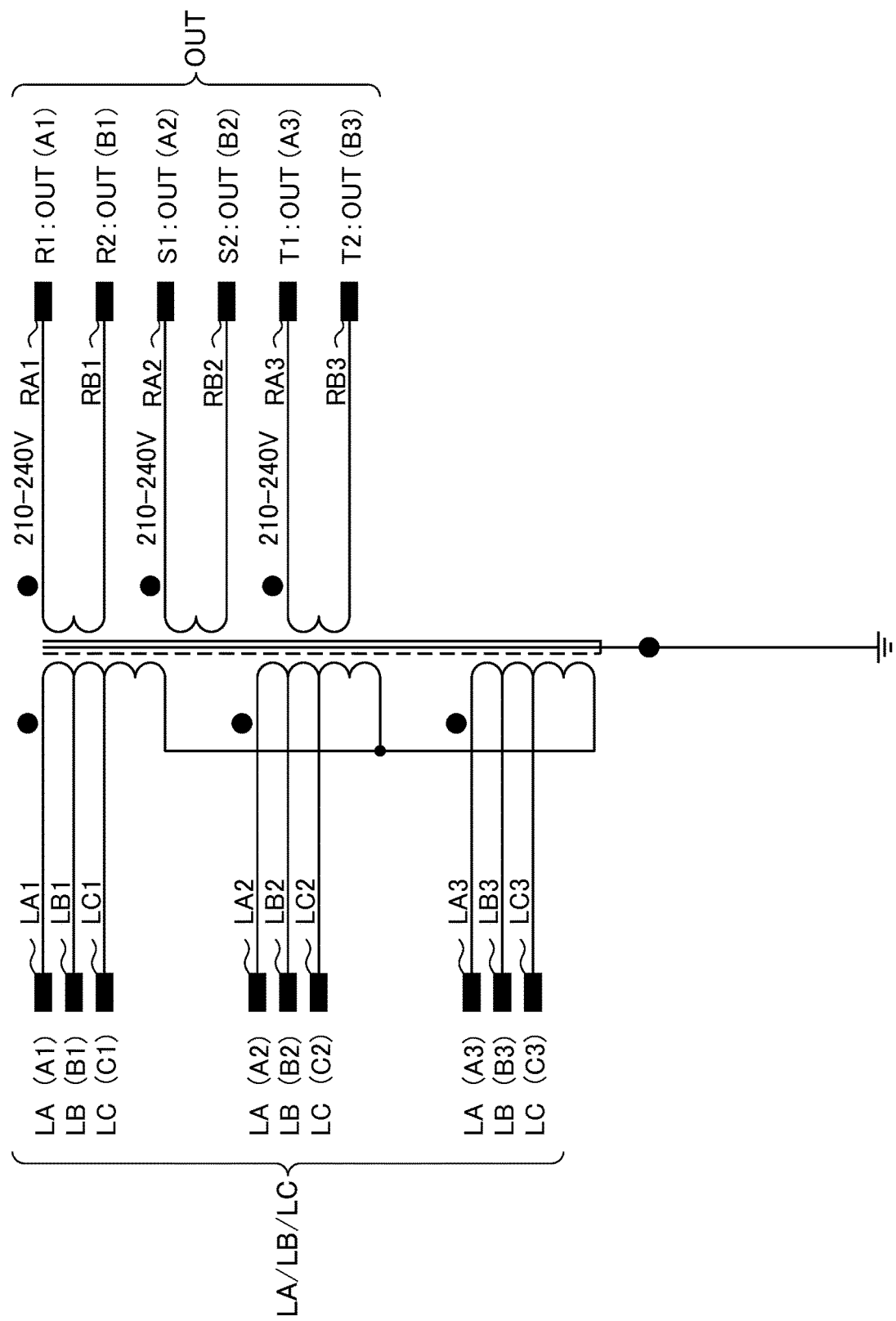
FIG. 3 is a detailed view of a transformer according to the first embodiment of the present invention.

FIG. 3 is a detailed view of the transformer according to the first embodiment of the present invention. Here, when the transformers 11 to 14 are not distinguished from each other, description is made with the transformer 11. The transformer 11 includes a plurality of input terminals LA1 to LA3, LB1 to LB3, and LC1 to LC3, and voltages of different voltage ranges are input to the input terminals. No matter to which of the input terminals the voltage is input, the same voltage is output to output terminals RA1 to RA3, RB1 to RB3.

When different voltages are applied for each input terminal of the transformer 11, the transformer 11 can output a fixed voltage from the output terminals. For example, a voltage equal to or larger than 500 [V] is input to the input terminals LA1 to LA3, and the transformer 11 outputs a fixed 200 [V] from the output terminals RA1 to RA3, RB1 to RB3. A voltage of 480 [V] is input to the input terminals LB1 to LB3, and the transformer 11 outputs a fixed voltage 200 [V] from the output terminals RA1 to RA3, RB1 to RB3. A voltage of 380 [V] to 400 [V] is input to the input terminals LC1 to LC3, and the transformer 11 outputs a fixed voltage 200 [V] from the output terminals RA1 to RA3, RB1 to RB3. The black circle in the drawing indicates a polarity, and the output terminals are wired in a delta connection, for example.

Figure 4:
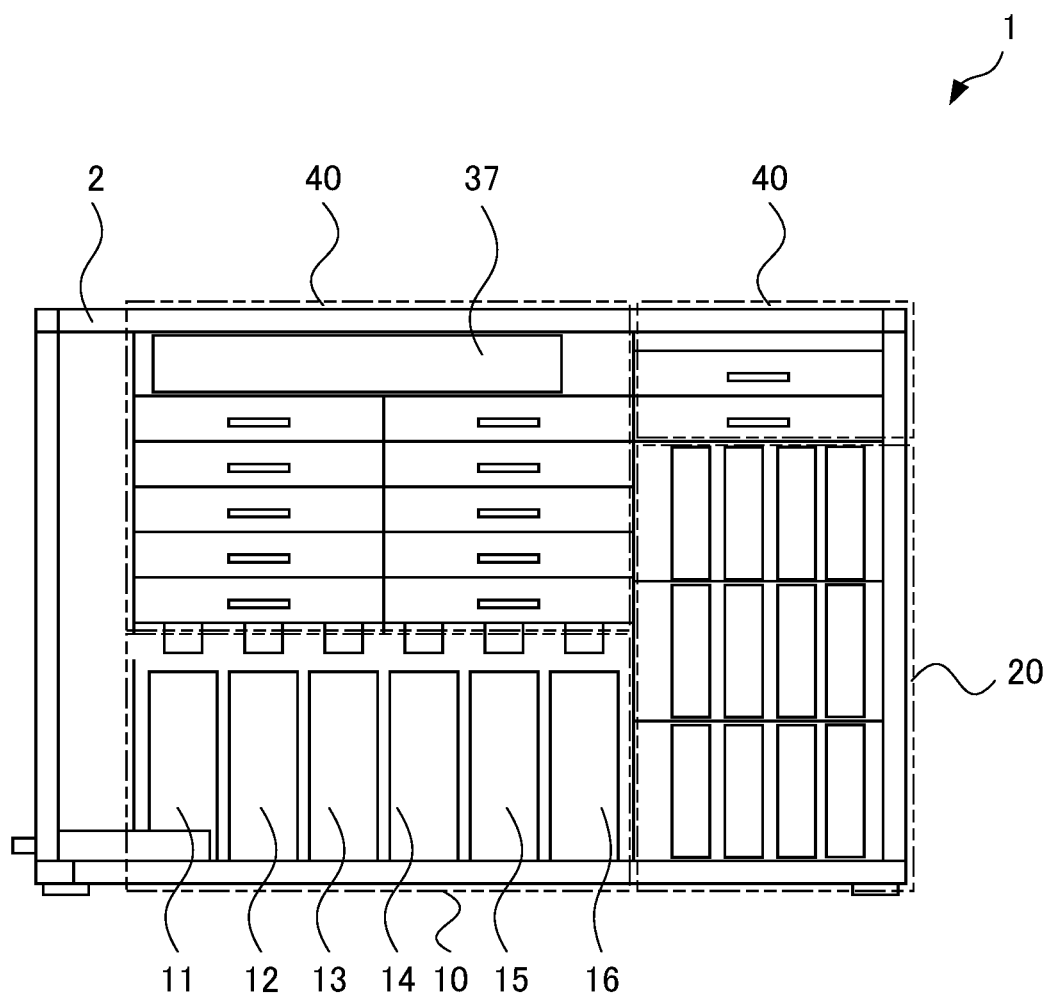
FIG. 4 is a front view showing an external appearance according to a second embodiment of the present invention.

FIG. 4 is a front view showing an external appearance of a laser oscillator according to a second embodiment. The difference from the first embodiment is the arrangement of the transformer unit 10. The transformer unit 10 is arranged below a part of the oscillator unit 40. The input power supply unit 20 is provided at the right of the transformer unit 10, and the oscillator unit 40 is provided over and above the transformer unit 10 and the input power supply unit 20. The transformer unit 10 is provided with the transformers 11 to 16.

Figure 5:
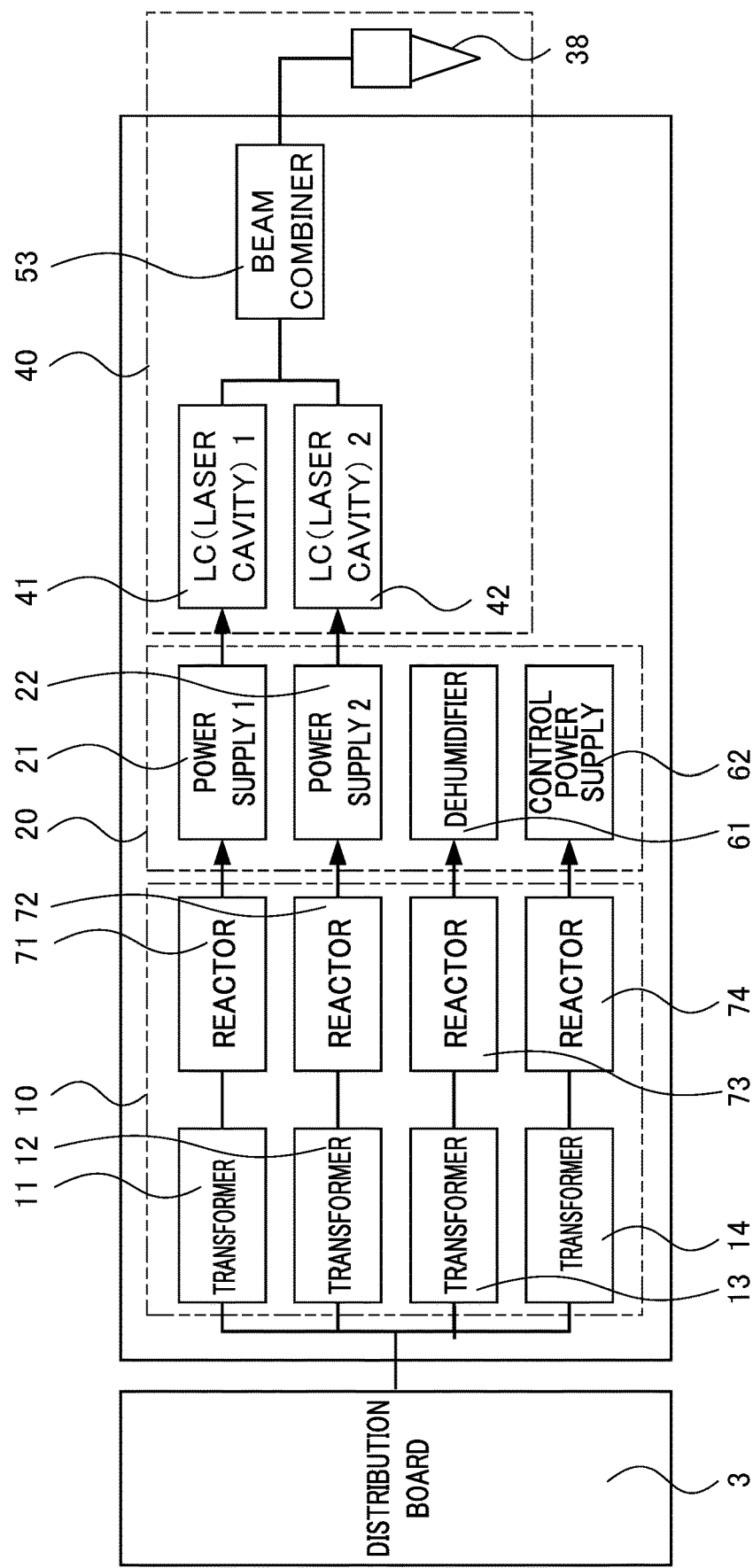
FIG. 5 is a diagram showing an electrical configuration of a laser oscillator according to a third embodiment of the present invention.

FIG. 5 is a diagram showing an electrical configuration of a laser oscillator according to a third embodiment. The difference from the first embodiment is a feature that reactors 71 to 74 are further provided in the preceding stage of the input power supply unit 20. The reactors 71 to 74 are examples of a power factor control unit for improving the power factor.

The reactor 71 is provided between the transformer 11 and the input power supply 21, the reactor 72 is provided between the transformer 12 and the input power supply 22, the reactor 73 is provided between the transformer 13 and the dehumidifier 61, and the reactor 74 is provided between the transformer 14 and the control power supply 62. The reactors 71 to 74 are inductances for improving the power factor of the transformers 11 to 14. However, the reactors 71 to 74 may alternatively be an electric circuit for approximating the power factor to 1 with a power factor adjustment circuit. The reactors 71 to 71 may be provided in the input power supply unit 20.

According to the embodiments described above of the present invention, effects as below are obtained. As shown in FIG. 1A and FIG. 1B, the transformer unit 10 is arranged in the vertical direction with respect to the oscillator unit 40 and the input power supply unit 20, so that the installation area is advantageously relatively smaller as compared with a case where the transformer unit 10 is arranged in the horizontal direction. Even when the number of transformers increases due to increase of the output intensity of the laser oscillator 1, the length in the horizontal direction does not increase even if the length in the vertical direction of the region where the transformer unit 10 is accommodated increases.

With the transformer 11 shown in FIG. 3, a predetermined voltage can be output even with respect to various voltage supplies that are different depending on the country, for example, power supplies of different voltages or different connection methods. When the power factor control unit as shown in FIG. 5 is provided in the preceding stage of the input power supply unit 20, a reactive current decreases, so that the current flowing through the transformer unit 10 decreases. Thus, the transformer unit 10 can be made compact.

Although embodiments of the present invention have been described above, the present invention is not limited to the embodiments described above. The effects described in the embodiments are merely the most preferable effects generated from the present invention, and effects of the present invention are not limited to those described in the embodiments.

For example, although a reactor is used as a power factor control unit in the embodiments described above, the power factor control unit is not limited to this, and various rectifier circuits that can connect with the input power supply unit 20 may be applied as the power factor control unit. In addition, the vertical relationship in the arrangement of the transformer unit 10, the input power supply unit 20, and the oscillator unit 40 in FIG. 1A and FIG. 1B is not limited to this. For example, the beam combiner 37 may be arranged further lower, and the transformer unit 10 may be arranged higher than the input power supply unit 20 or the oscillator unit. 40 according to load resistance of the cabinet 2. Moreover, the cabinet 2 may be separated into a plurality of pieces, and the laser oscillator 1 may have a configuration in which the separated pieces of the cabinet 2 are stacked with each other.

EXPLANATION OF REFERENCE NUMERALS

1 Laser oscillator, 2 Cabinet, 3 Distribution board, 10 Transformer unit, 71 to 74 Reactor, 20 Input power supply unit, 21 to 32 Input power supply, 40 Oscillator unit, 41 to 52 Laser cavity unit, 53 Beam combiner, 38 Laser cutting head, LA1 to LA3 Input terminal, LB1 to LB3 Input terminal, LC1 to LC3 Input terminal, RA1 to RA3 Output terminal, RB1 to RB3 Output terminal

What is claimed is:

1. A laser oscillator comprising: a transformer unit that adjusts a power supply voltage;
as input power supply unit that inputs the voltage adjusted by the transformer unit to an oscillator unit; and
an oscillator unit that is connected to the input power supply unit and outputs a laser beam according to the voltage of the input power supply unit,
wherein the transformer unit is arranged below at least a part of the oscillator unit.

2. The laser oscillator according to claim 1, wherein the transformer unit comprises a plurality of transformers,
the input power supply unit comprises a plurality of input power supplies, and
the input power supplies are provided for each of the transformers.

3. The laser oscillator according to claim 1, wherein each of the transformers comprises a plurality of input terminals, and a plurality of output terminals corresponding to the plurality of input terminals, respectively, and
each of the transformers converts a voltage input from each of the plurality of input terminals into a predetermined voltage to output the predetermined voltage from the corresponding plurality of output terminals.

4. The laser oscillator according to claim 2, wherein each of the transformers comprises a plurality of input terminals, and a plurality of output terminals corresponding to the plurality of input terminals, respectively, and
each of the transformers converts a voltage input from each of the plurality of input terminals into a predetermined voltage to output the predetermined voltage from the corresponding plurality of output terminals.

5. The laser oscillator according to claim 1, further comprising a power factor control unit for improving a power factor of the transformer unit in a preceding stage of the input power supply unit.

6. The laser oscillator according to claim 2, further comprising a power factor control unit for improving a power factor of the transformer unit in a preceding stage of the input power supply unit.

7. The laser oscillator according to claim 3, further comprising a power factor control unit for improving a power factor of the transformer unit in a preceding stage of the input power supply unit.

8. The laser oscillator according to claim 4, further comprising a power factor control unit for improving a power factor of the transformer unit in a preceding stage of the input power supply unit.

* * * * *